(12) United States Patent
Ohba et al.

(10) Patent No.: US 12,027,972 B2
(45) Date of Patent: Jul. 2, 2024

(54) POWER SUPPLY CONTROL SEMICONDUCTOR DEVICE AND POWER SUPPLY DEVICE

(71) Applicants: Yusuke Ohba, Tokyo (JP); Naoya Nishio, Tokyo (JP); Koji Tsuzurabara, Tokyo (JP); Hiroki Matsuda, Tokyo (JP)

(72) Inventors: Yusuke Ohba, Tokyo (JP); Naoya Nishio, Tokyo (JP); Koji Tsuzurabara, Tokyo (JP); Hiroki Matsuda, Tokyo (JP)

(73) Assignee: MITSUMI ELECTRIC CO., LTD., Tokyo (JP)

( * ) Notice: Subject to any disclaimer, the term of this patent is extended or adjusted under 35 U.S.C. 154(b) by 16 days.

(21) Appl. No.: 18/166,060

(22) Filed: Feb. 8, 2023

(65) Prior Publication Data
US 2023/0268828 A1 Aug. 24, 2023

(30) Foreign Application Priority Data
Feb. 24, 2022 (JP) .................. 2022-026608

(51) Int. Cl.
*H02M 3/00* (2006.01)
*H01L 23/31* (2006.01)
*H01L 23/495* (2006.01)
*H02M 3/335* (2006.01)

(52) U.S. Cl.
CPC ........ *H02M 3/003* (2021.05); *H01L 23/3107* (2013.01); *H01L 23/49541* (2013.01); *H02M 3/335* (2013.01)

(58) Field of Classification Search
CPC .... H02M 3/003; H02M 3/335; H02M 1/0009; H02M 1/32; H02M 3/33523; H02M 1/08; H01L 23/3107; H01L 23/49541; H01L 23/49506; H01L 23/49513; H01L 23/49562; H01L 23/48
See application file for complete search history.

(56) References Cited

U.S. PATENT DOCUMENTS

2018/0019656 A1 1/2018 Matsuda et al.
2023/0420930 A1* 12/2023 Ishikawa ............. G06F 11/0739

FOREIGN PATENT DOCUMENTS

JP 2016-158310 9/2016

* cited by examiner

*Primary Examiner* — Jung Kim
(74) *Attorney, Agent, or Firm* — IPUSA, PLLC

(57) ABSTRACT

A power supply control semiconductor device that generates and outputs a drive pulse to turn on and off a switch, which is configured to intermittently supply a current to a primary winding of a voltage conversion transformer, in response to input of a voltage proportional to the current flowing through the primary winding of the voltage conversion transformer and an output voltage detection signal from a secondary side of the voltage conversion transformer is provided. The power supply control semiconductor device is in a no-lead resin-sealed package. The package includes external terminals including a first terminal as an input terminal, a second terminal provided next to the first terminal, and third terminals that have a lower breakdown voltage relative to the first terminal and are different from the second terminal. An interval between the first terminal and the second terminal is wider than each interval between the third terminals.

11 Claims, 16 Drawing Sheets

FIG.2A
FIG.2B
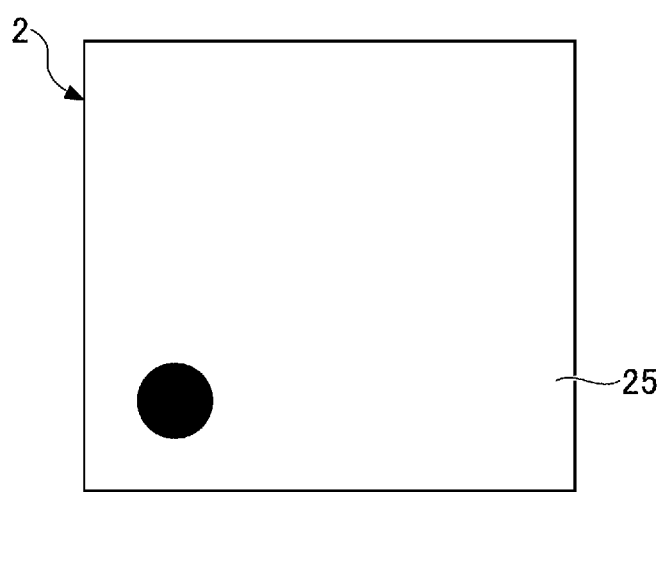
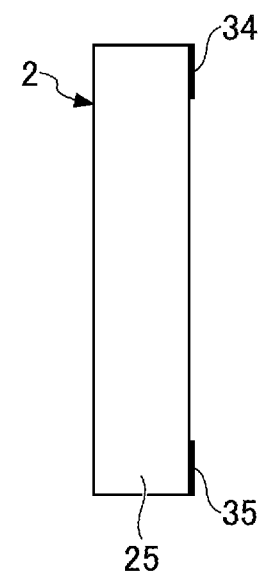

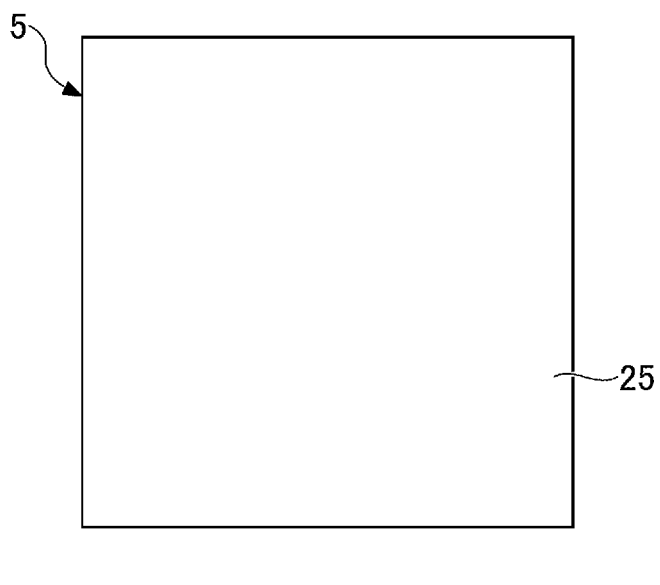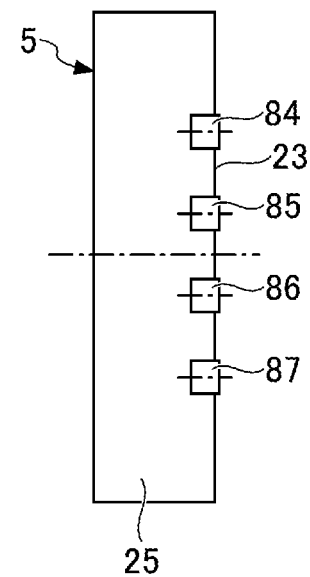

POWER SUPPLY CONTROL SEMICONDUCTOR DEVICE AND POWER SUPPLY DEVICE

CROSS-REFERENCE TO RELATED APPLICATIONS

This application is based on and claims priority to Japanese Patent Application No. 2022-026608, filed Feb. 24, 2022, the entire contents of which are incorporated herein by reference.

BACKGROUND OF THE INVENTION

1. Field of the Invention

The present disclosure relates to power supply control semiconductor devices and power supply devices.

2. Description of the Related Art

Conventionally, there is known a power supply control semiconductor device that generates and outputs a drive pulse to turn on and off a switching element, which is configured to intermittently supply a current to a primary winding of a voltage conversion transformer, in response to input of a voltage that is proportional to a current flowing through the primary winding of the transformer and an output voltage detection signal that is from a secondary side of the transformer (for example, see Patent Document 1).

In conventional power supply control semiconductor devices, a relatively large, leaded package such as a small outline package (SOP) is used as a measure against heat generation and flow soldering. Power supply control semiconductor devices are also equipped with terminals (high-voltage terminals) that have a relatively high breakdown voltage to withstand the input of a relatively high voltage.

However, reducing the size of a power supply control semiconductor device reduces the shortest distance between a high voltage terminal and its peripheral conductor portion (for example, a terminal next to the high voltage terminal), thus increasing the likelihood that the high voltage terminal and its peripheral conductor portion may short-circuit. Therefore, it is difficult to reduce the size of a power supply control semiconductor device unless some countermeasures are taken.

RELATED-ART DOCUMENTS

Patent Documents

Patent Document 1: Japanese Patent Application Publication Laid-Open No. 2016-158310.

SUMMARY OF THE INVENTION

According to one aspect of the disclosure, there is provided a power supply control semiconductor device that generates and outputs a drive pulse to turn on and off a switch, which is configured to intermittently supply a current to a primary winding of a voltage conversion transformer, in response to input of a voltage that is proportional to the current flowing through the primary winding of the voltage conversion transformer and an output voltage detection signal that is from a secondary side of the voltage conversion transformer, wherein a package of the power supply control semiconductor device is a no-lead resin-sealed package. The package includes a plurality of external terminals including a first terminal that is an input terminal to which an AC voltage or a rectified voltage is input, a second terminal provided next to the first terminal, and a plurality of third terminals that have a lower breakdown voltage relative to the first terminal and are different from the second terminal. An interval between the first terminal and the second terminal is wider than each interval between the plurality of third terminals.

According to another aspect of the present disclosure, there is provided a power supply control semiconductor device that generates and outputs a drive pulse to turn on and off a switch, which is configured to intermittently supply a current to a primary winding of a voltage conversion transformer, in response to input of both a voltage that is proportional to the current flowing through the primary winding of the voltage conversion transformer and an output voltage detection signal that is from a secondary side of the voltage conversion transformer, wherein a package of the power supply control semiconductor device is a no-lead resin-sealed package. The package includes a plurality of external terminals including a first terminal that is an input terminal to which an AC voltage or a rectified voltage is input, a second terminal provided next to the first terminal, a plurality of third terminals that have a lower breakdown voltage relative to the first terminal and are different from the second terminal, and an exposed tab provided on a bottom surface of the power supply control semiconductor device. A shortest distance between the exposed tab and the first terminal is longer than a shortest distance between the exposed tab and any one of the plurality of external terminals other than the first terminal.

BRIEF DESCRIPTION OF THE DRAWINGS

FIG. 2A is a plan view of a resin-sealed semiconductor device according to the second embodiment;

FIG. 2B is a right side view of the resin-sealed semiconductor device according to the second embodiment;

FIG. 5A is a plan view of a resin-sealed semiconductor device according to the fifth embodiment;

FIG. 5B is a right side view of the resin-sealed semiconductor device according to the fifth embodiment;

DESCRIPTION OF THE EMBODIMENTS

Figure 1A:
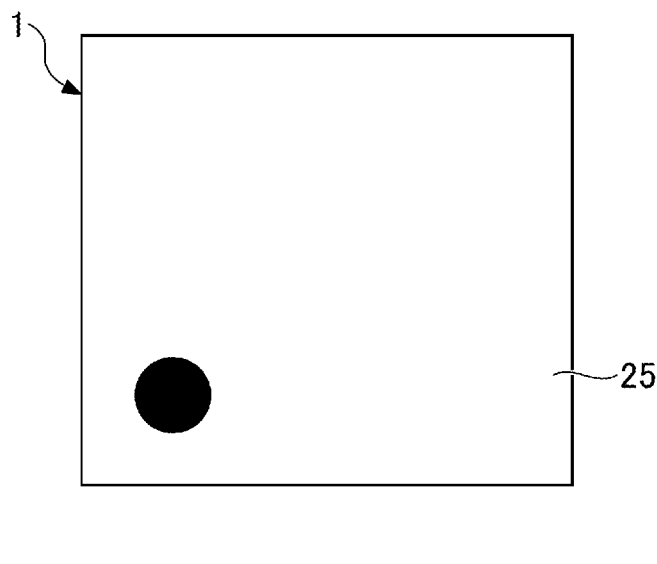
FIG. 1A is a plan view of a resin-sealed semiconductor device according to the first embodiment.
Figure 1B:
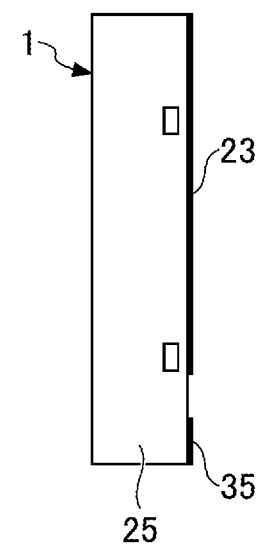
FIG. 1B is a right side view of the resin-sealed semiconductor device according to the first embodiment.
Figure 1C:
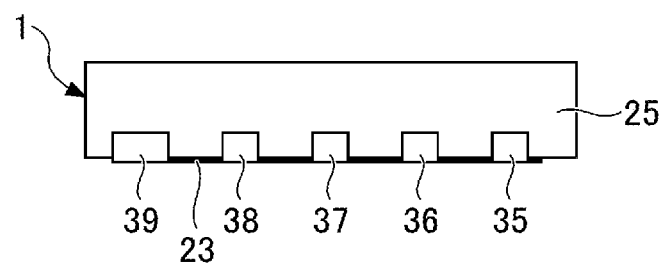
FIG. 1C is a front view of the resin-sealed semiconductor device according to the first embodiment.

According to the present disclosure, a compact power-supply control semiconductor device including a high voltage terminal and a power supply device including the power supply control semiconductor device can be provided.

Embodiments will be described hereinafter.

FIGS. 1A to 1D are views illustrating a semiconductor device 1 as an example of a resin-sealed semiconductor device according to the first embodiment. FIG. 1A, FIG. 1B, FIG. 1C, and FIG. 1D are a plan view, a right side view, a front view, and a bottom view, respectively, of the semiconductor device 1. The semiconductor device 1 is a resin-sealed semiconductor device that includes a plurality of external terminals (nine external terminals 31 to 39 in this example) connected to a semiconductor chip electrode via wires. The package of the semiconductor device 1 is a small outline no-lead (SON) package.

The semiconductor device 1 includes a resin-sealed package 25 with four side surfaces. The resin-sealed package 25 includes a first side surface, a second side surface opposing the first surface, a third side surface next to the first side surface and the second side surface, and a fourth side surface opposing the third side surface. In this example, the four external terminals 31 to 34 are provided on the first side surface, and the remaining five external terminals 35 to 39 are provided on the second side surface.

The external terminal 31 is an example of a first terminal that serves as an input terminal for an AC voltage or a rectified voltage. The external terminal 32 is an example of a second terminal that is provided next to the first terminal. The external terminals 33 to 39 are examples of a plurality of third terminals with a lower breakdown voltage relative to the first terminal and are different from the second terminal. At least one of the external terminals 33 to 39 may be, instead of the third terminal, a fourth terminal with a higher breakdown voltage relative to the plurality of third terminals but with a lower breakdown voltage relative to the first terminal.

The first terminal is, for example, a high voltage terminal having a breakdown voltage of 500 volts or more. The upper limit of the breakdown voltage of the first terminal is not particularly limited, but may be, for example, 1000 volts or less. The terminal is, for example, a medium voltage terminal having a breakdown voltage of 15 volts or more and 50 volts or less or a low voltage terminal having a breakdown voltage of 7 volts or less. Each third terminal is a terminal other than the second terminal, which is provided next to the first terminal. Each third terminal is, for example, a medium voltage terminal having a breakdown voltage of 15 volts or more and 50 volts or less or a low voltage terminal having a breakdown voltage of 7 volts or less. The fourth terminal is a terminal with a higher breakdown voltage relative to the third terminal and with a lower breakdown voltage relative to the first terminal. The fourth terminal is, for example, a second high-voltage terminal having a breakdown voltage of 100 volts or more and 400 volts or less.

An interval P1 between the high-voltage external terminal 31 and the external terminal 32, which is next to the external terminal 31, is wider than the interval P3 between the low-voltage external terminals 35 and 36. In the example illustrated in FIG. 1D, in a case where the widths of the external terminals 31, 32, 35, and 36 are equal, a pitch p1 between the external terminal 31 and the external terminal 32 is wider than a pitch p3 between the external terminal 35 and the external terminal 36. As a result, a relatively wide interval P1 is ensured. Hence, even when an AC voltage or a rectified voltage with a relatively high voltage value is input to the external terminal 31, it is possible to suppress the potential occurrence of a short circuit between the external terminal 31 and the external terminal 32, and thus reduce failures that lead to IC breakdowns. In this manner, it is possible to provide a countermeasure against short circuits between terminals. Further, an SON package that is leadless and can be made smaller than an SOP package is employed as the package of the semiconductor device 1. Therefore, the compact semiconductor device 1 that includes a high voltage terminal can be provided.

Note that the interval P1 may be wider than an interval between other low voltage terminals. For example, the interval P1 may be wider than the interval between the external terminal 33 and the external terminal 34 or the interval between the external terminal 37 and the external terminal 38. Further, an interval between terminals corresponds to the length of a gap between the terminals. In other words, the interval between terminals corresponds to the shortest distance between the terminals in the terminal width direction. The pitch corresponds to the center-to-center distance between terminals in the terminal width direction.

Figure 1D:
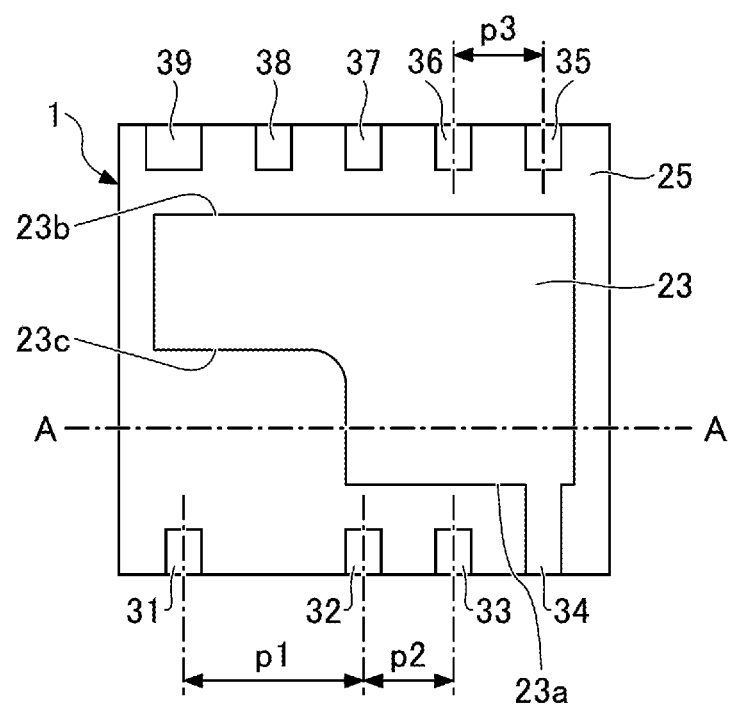
FIG. 1D is a bottom view of the resin-sealed semiconductor device according to the first embodiment.

The high-voltage external terminal 31, the external terminal 32 next to the external terminal 31, and the low-voltage external terminals 33 and 34 may all be provided on the first side surface as illustrated in FIG. 1D. In this manner, even in a configuration in which the low-voltage external terminals 33 and 34 are provided on the same side surface as the external terminal 31, a relatively wide interval P1 may be set. Hence, even if an AC voltage or a rectified voltage having a relatively high voltage value is input to the external terminal 31, it is possible to suppress the potential occurrence of a short circuit between the external terminal 31 and the external terminal 32, and thus reduce failures that lead to IC breakdowns.

Further, the external terminal 32 provided next to the high-voltage external terminal 31 may be a low voltage terminal with a lower breakdown voltage relative to the external terminal 31. In such a case, the interval P1 between the high-voltage external terminal 31 and the external terminal 32 that is provided next to the external terminal 31 is wider than an interval P2 between the low-voltage external terminals 32 and 33. In the example illustrated in FIG. 1D, in a case where the widths of the external terminals 31, 32, and 33 are equal, the pitch p1 between the external terminal 31 and the external terminal 32 is wider than a pitch p2 between the external terminal 32 and the external terminal 33. As a result, a relatively wide interval P1 is ensured. Hence, even when an AC voltage or a rectified voltage with a relatively high voltage value is input to the external terminal 31, it is possible to suppress the potential occurrence of a short circuit between the external terminal 31 and the external terminal 32s, and thus reduce failures that lead to IC breakdowns.

The external terminal 32 may be an electrically floating terminal, that is, a not connected (NC) terminal. Employing such a configuration allows the external terminal 32 to be electrically floating from the internal circuit of the semiconductor device 1. As a result, even in a case where an AC voltage with a relatively high voltage value is input to the external terminal 31 and a short circuit occurs between the external terminal 31 and the external terminal 32, it is possible to suppress the impact on the internal circuit of the semiconductor device 1 via the external terminal 32.

The plurality of external terminals provided in the semiconductor device 1 may include a second high-voltage terminal with a higher breakdown voltage relative to the plurality of low voltage terminals described above and with a lower breakdown voltage relative to the first high-voltage terminal (the external terminal 31 in this example). The second high-voltage terminal may be a terminal provided on a different side surface from the first side surface on which the first high-voltage terminal is provided. For example, the second high-voltage terminal may be provided on the second side surface opposite the first side surface on which the first high-voltage terminal is provided. On the second side surface that opposes the first side surface including the first high-voltage terminal, the second high-voltage terminal may be, for example, an external terminal (the external terminal 39 in this example) provided in a terminal position on the opposite side of the first high-voltage terminal (the external terminal 31 in this example) in a bottom view of the semiconductor device 1.

For example, the second high-voltage terminal (the external terminal 39 in this example), which is provided in the terminal position on the opposite side of the first high-voltage terminal (the external terminal 31 in this example) that is an AC voltage input terminal in a bottom view, may be a DC voltage input terminal. As a result, the first high-voltage terminal and the second high-voltage terminal, both of which are voltage input terminals, are provided closer to the fourth side surface on one side in a bottom view of the semiconductor device 1. Hence, it becomes easier to design the layout of the voltage input circuit in the semiconductor device 1.

Figure 6:
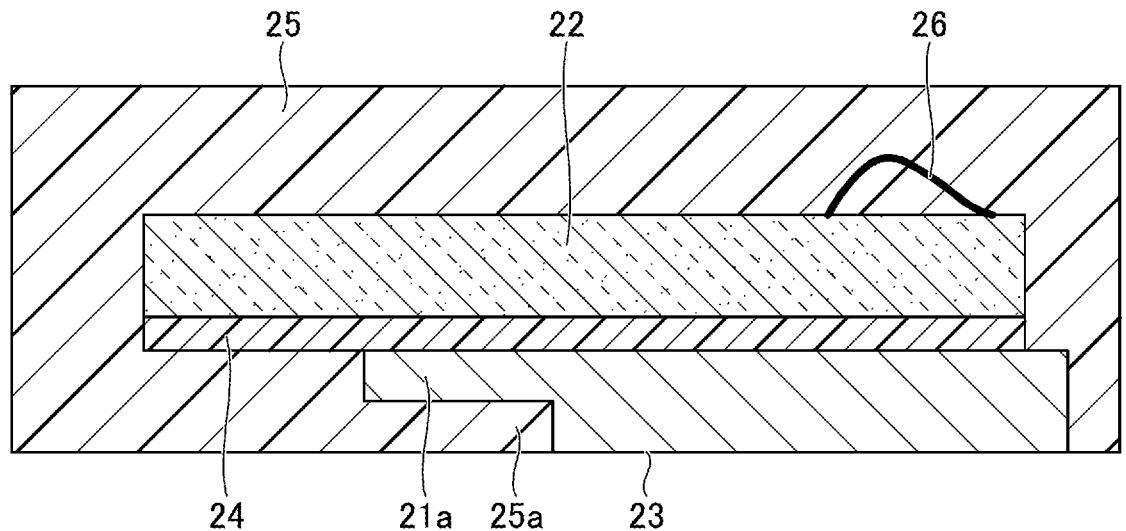
FIG. 6 is a cross-sectional view taken along a line A-A of FIG. 1D.

A tab 23 that is exposed from the resin-sealed package 25 may be provided on the bottom surface of the semiconductor device 1. The tab 23 functions as a heat dissipation tab for the semiconductor device 1. FIG. 6 is a cross-sectional view taken along a line A-A of FIG. 1D. As illustrated in FIG. 6, a semiconductor chip 22 is mounted on the tab 23. The heat generated from the semiconductor chip 22 is transferred from the tab 23 to the outside. More specifically, the heat generated from the semiconductor chip 22 is transferred from the tab 23 to the substrate on which the semiconductor device 1 is mounted. The tab 23 may be a die pad.

In a plan view of FIG. 1D, the shortest distance between the tab 23 and the high-voltage external terminal 31 is longer than the shortest distance between the tab 23 and a terminal of the plurality of external terminals other than the first terminal. For example, the shortest distance between the tab 23 and the high-voltage external terminal 31 may be longer than the shortest distance between the tab 23 and the external terminal 33, which is a terminal other than the external terminal 31 among the plurality of external terminals 31 to 39. As result, a wider interval can be ensured between the tab 23 and the external terminal 31 compared to the interval between the tab 23 and each terminal other than the first terminal. Hence, even when an AC voltage or a rectified voltage that is higher than the breakdown voltage of the second terminal is input to the external terminal 31, it is possible to suppress the potential occurrence of a short circuit between the external terminal 31 and the external terminal 32, and thus reduce failures that lead to IC breakdowns. In this manner, it is possible to take measures against a short circuit between the external terminal 31 and the tab 23. Further, an SON package that is leadless and can be made smaller than an SOP package is employed as the package of the semiconductor device 1. Therefore, the compact semiconductor device 1 that includes a high voltage terminal can be provided.

In the example illustrated in FIG. 1D, the tab 23 has an outer shape that includes two opposing sides 23a and 23b. The tab 23 includes a cutout 23c that is offset from the side 23a. Providing the cutout 23c increases the interval (distance) between the high-voltage external terminal 31 and the tab 23 compared to a configuration without the cutout 23c. Hence, it is possible to suppress the potential occurrence of a short circuit between the tab 23 and the external terminal 31, and to thus reduce failures that lead to IC breakdowns. The area between the external terminal 31 and the tab 23 is filled with the resin of the resin-sealed package 25.

In FIG. 6, the tab 23 includes an upper surface to which the semiconductor chip 22 is attached via an insulating film 24, and a lower surface that is exposed from the resin-sealed package 25. The tab 23 is formed by, for example, a conductive plate (for example, a lead frame) such as a copper plate. The tab 23 includes a half-etched plate portion 21a. The plate portion 21a and the portion where the tab 23 has been removed by etching are covered with resin to form the above-described cutout 23c. A clearance can be ensured between the tab 23 and the high-voltage terminal by expanding an area (a resin area 25a) where the tab 23 is half-etched in the vicinity of the high voltage terminal. The resin area 25a is an area that expands below the plate portion 21a. In terms of ensuring clearance between the high voltage terminal and the tab 23, it is preferable to employ a cutout structure that is not half-etched. However, a half-etched structure may be employed in consideration of the stability and the reliability of the die bonding of the semiconductor chip 22 and the bonding of the wire 26.

In FIG. 1D, the external terminal 34 may be a ground terminal that is connected to the tab 23 at the bottom surface of the semiconductor device 1. Such a configuration allows the tab 23 to be mounted onto the ground surface of the substrate (not illustrated) by soldering or the like even in a case where a solder joint failure or a missing solder joint occurs in the external terminal 34. As a result, the grounding of the external terminal 34 can be ensured. Note that in a configuration with or without the connection to the tab 23, the ground terminal may be an external terminal other than the external terminal 34.

FIGS. 2A to 2D are views illustrating a semiconductor device 2 as an example of a resin-sealed semiconductor device according to the second embodiment. FIG. 2A, FIG. 2B, FIG. 2C, and FIG. 2D are a plan view, a right side view, a front view, and a bottom view, respectively, of the semiconductor device 2. In the second embodiment, a description of the same configurations, actions, and effects as those of the above-described embodiment will be simplified or omitted by referring to the descriptions already given above.

Figure 7:
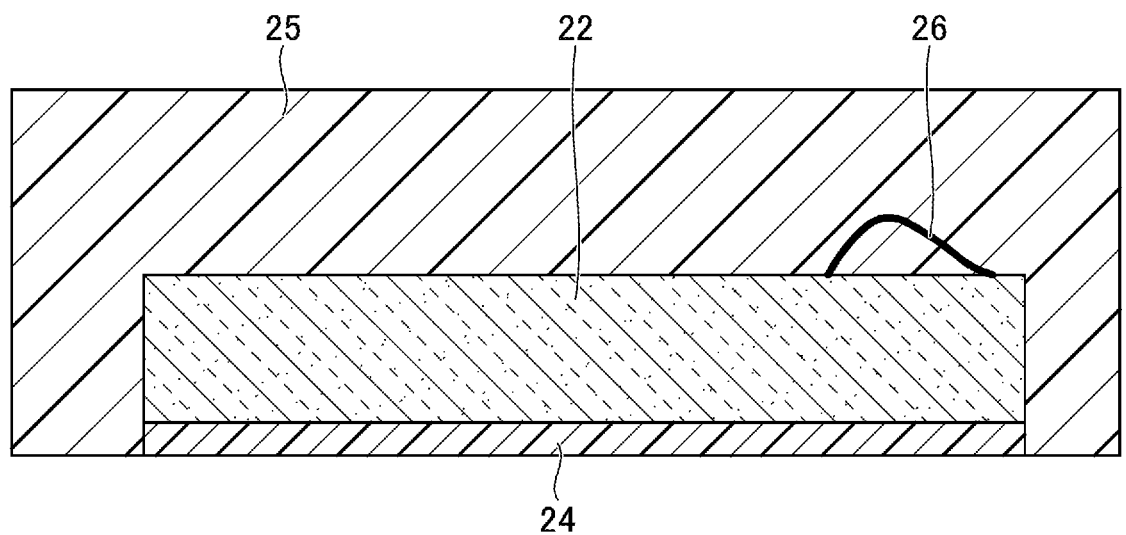
FIG. 7 is a cross-sectional view taken along a line B-B of FIG. 2D.

The semiconductor device 2 according to the second embodiment differs from the semiconductor device 1 according to the first embodiment in that the insulating film 24 that is exposed from the resin-sealed package 25 is included on the bottom surface of the semiconductor device 2. FIG. 7 is a cross-sectional view taken along a line B-B of FIG. 2D. As illustrated in FIG. 7, the insulating film 24 is bonded to the lower surface of the semiconductor chip 22. A specific example of the insulating film 24 may be a die attach film (DAF) that is adhesively attached to the semiconductor chip 22.

The semiconductor device 2 includes a bottom surface from which the insulating film 24 is exposed instead of the tab 23. As a result, the degree of freedom in the layout of the interconnects formed on the substrate on which the semiconductor device 2 is mounted below the bottom surface of the semiconductor device 2 is improved.

Figure 3A:
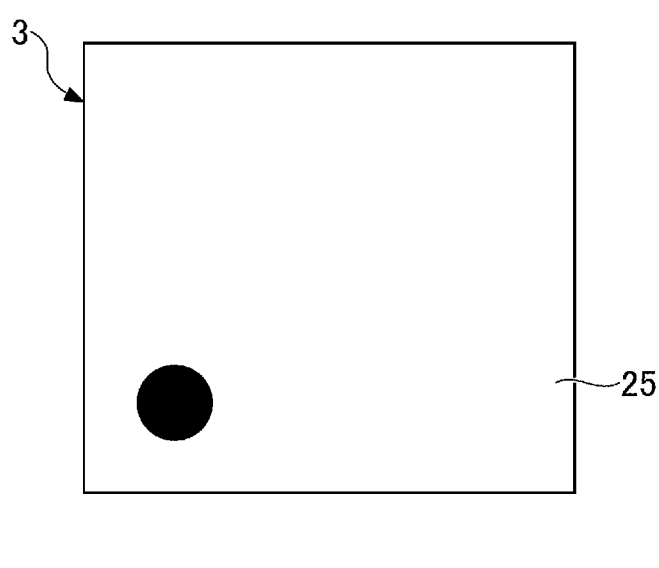
FIG. 3A is a plan view of a resin-sealed semiconductor device according to the third embodiment.
Figure 3B:
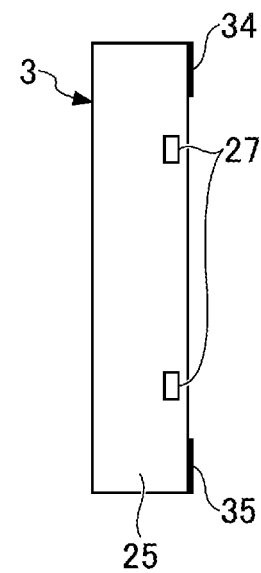
FIG. 3B is a right side view of the resin-sealed semiconductor device according to the third embodiment.
Figure 3C:
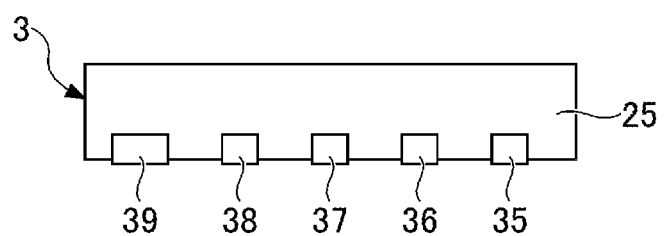
FIG. 3C is a front view of the resin-sealed semiconductor device according to the third embodiment.

FIGS. 3A to 3D are views illustrating a semiconductor device 3 as an example of a resin-sealed semiconductor device according to the third embodiment. FIG. 3A, FIG. 3B, FIG. 3C, and FIG. 3D are a plan view, a right side view, a front view, and a bottom view, respectively, of the semiconductor device 3. FIG. 3E illustrates a modification of FIG. 3B. FIG. 3B illustrates a configuration in which the tab 23 is to be upset, and FIG. 3E illustrates a configuration in which the entire surface of the tab 23 is to be half-etched. A lead 27 for connecting the tab 23 is exposed from the side surface of the resin-sealed package 25. In the third embodiment, a description of the same configurations, actions, and effects as those of the above-described embodiments will be simplified or omitted by referring to the descriptions already given above.

The semiconductor device 3 according to the third embodiment differs from the semiconductor device 2 according to the second embodiment in that the insulating film 24 is not exposed from the resin-sealed package 25. The center portion of the bottom surface of the semiconductor device 3 is covered by the resin-sealed package 25. As a result, the degree of freedom in the layout of the interconnects formed on the substrate on which the semiconductor device 3 is mounted below the bottom surface of the semiconductor device 3 is improved.

FIGS. 4A to 4D are views illustrating a semiconductor device 4 as an example of a resin-sealed semiconductor device according to the fourth embodiment. FIG. 4A, FIG. 4B, FIG. 4C, and FIG. 4D are a plan view, a right side view, a front view, and a bottom view, respectively, of the semiconductor device 4. In the fourth embodiment, a description of the same configurations, actions, and effects as those of the above-described embodiments will be simplified or omitted by referring to the descriptions already given above.

The semiconductor device 4 according to the fourth embodiment differs from the semiconductor device 1 according to the first embodiment in that an external terminal 30 is provided in the semiconductor device 4. The external terminal 31 is an example of a first terminal that serves as an input terminal for an AC voltage or a rectified voltage. The external terminal 30 is an example of a second terminal that is provided next to the first terminal. The external terminals 32 to 39 are examples of a plurality of third terminals with a lower breakdown voltage relative to the first terminal and are different from the second terminal. At least one of the external terminals 32 to 39 may be, instead of the third terminal, a fourth terminal with a higher breakdown voltage relative to the plurality of third terminals and with a lower breakdown voltage relative to the first terminal.

The external terminal 30 is an electrically floating terminal, that is, a not connected (NC) terminal. Employing such a configuration allows the external terminal 30 to electrically float from the internal circuit of the semiconductor device 4. As a result, even in a case where an AC voltage with a relatively high voltage value is input to the external terminal 31, it is possible to suppress the potential occurrence of a short circuit between the external terminal 31 and the external terminal 30, and thus reduce failures that lead to IC breakdowns. Even in a case where a short circuit is generated between the external terminal 31 and the external terminal 30, the internal circuit of the semiconductor device 4 can be suppressed from being impacted by the short circuit via the external terminal 30.

To suppress the potential occurrence of a short circuit between the external terminal 31 and the external terminal 30 and thus reduce failures that lead to IC breakdowns, it is preferable for an interval P4 between the high-voltage external terminal 31 and the external terminal 30 provided next to the external terminal 31 to be wider than the interval P3 between the low-voltage external terminals 35 and 36. In the example illustrated in FIG. 4D, in a case where the widths of the external terminals 31, 30, 35, and 36 are equal, a pitch p4 between the external terminal 31 and the external terminal 30 is equal to the pitch p3 between the external terminal 35 and the external terminal 36. The interval P4 or the pitch p4 may be, however, wider or narrower than the interval P3 or the pitch p3. The interval P4 may be wider than the interval between other low voltage terminals. For example, the interval P4 may be wider than the interval between the external terminal 33 and the external terminal 34 and the interval between the external terminal 37 and the external terminal 38. The cutout 23c may be included in the tab 23 to ensure a clearance between the tab 23 and the high-voltage external terminal 31. Alternatively, the tab 23 may not include the cutout 23c (this is also applicable to FIG. 1D).

Figure 2C:
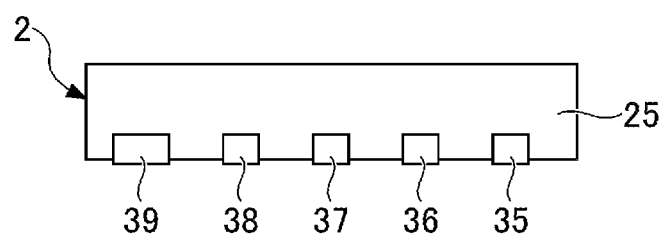
FIG. 2C is a front view of the resin-sealed semiconductor device according to the second embodiment.
Figure 2D:
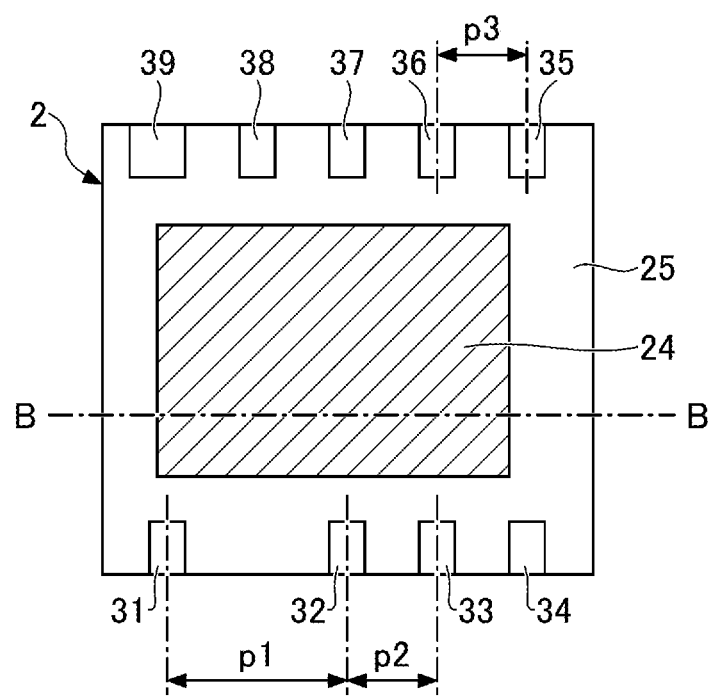
FIG. 2D is a bottom view of the resin-sealed semiconductor device according to the second embodiment.
Figure 3D:
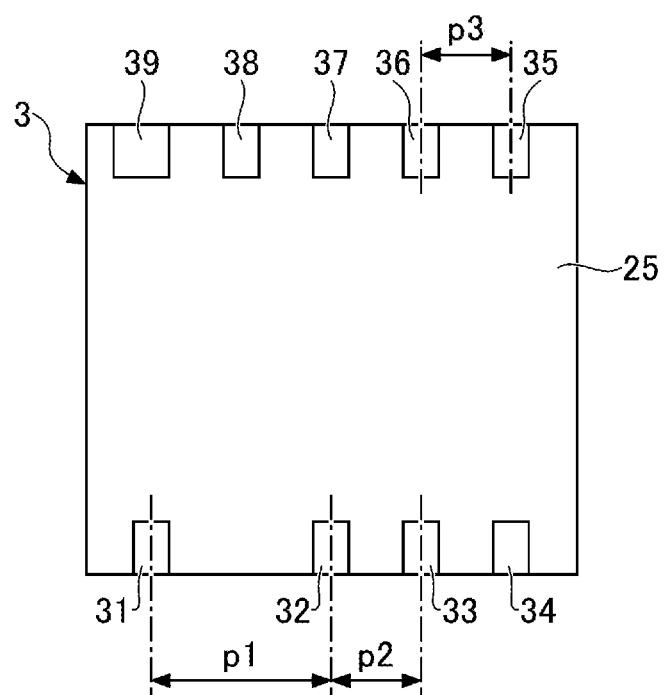
FIG. 3D is a bottom view of the resin-sealed semiconductor device according to the third embodiment.
Figure 3E:
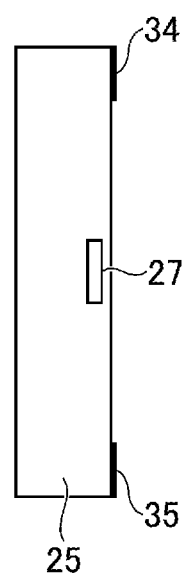
FIG. 3E is a right side view of a modification of the resin-sealed semiconductor device according to the third embodiment.
Figure 4A:
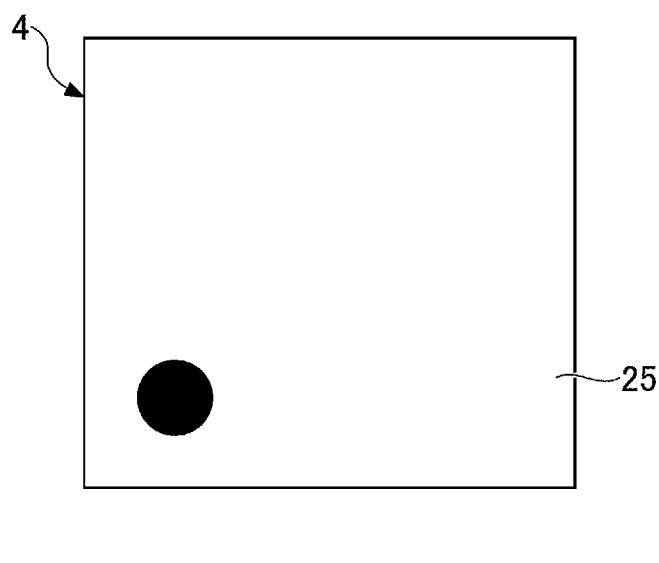
FIG. 4A is a plan view of a resin-sealed semiconductor device according to the fourth embodiment.
Figure 4B:
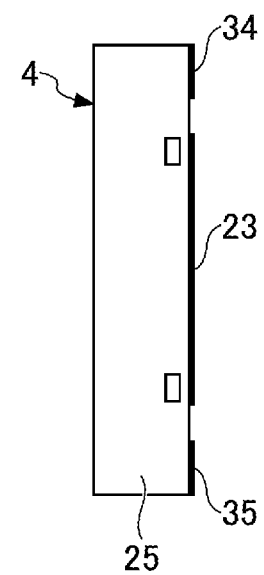
FIG. 4B is a right side view of the resin-sealed semiconductor device according to the fourth embodiment.
Figure 4C:
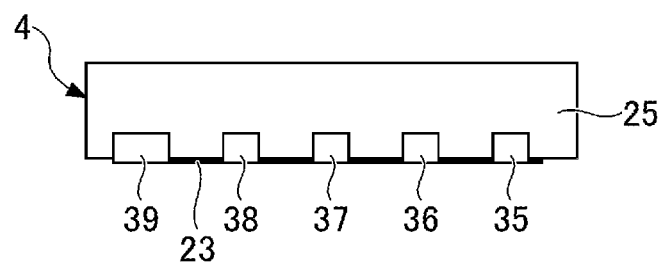
FIG. 4C is a front view of the resin-sealed semiconductor device according to the fourth embodiment.
Figure 4D:
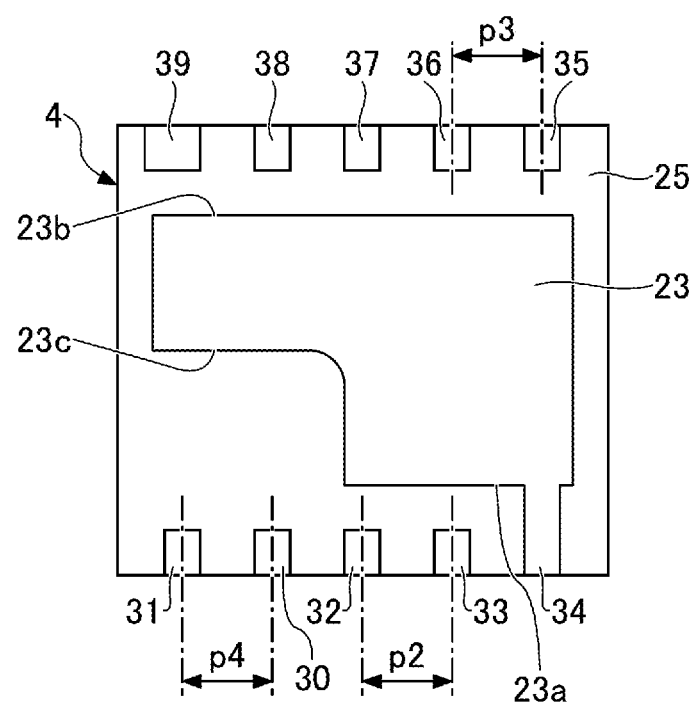
FIG. 4D is a bottom view of the resin-sealed semiconductor device according to the fourth embodiment.

As illustrated in FIG. 4D, the width of the external terminal 39 may be wider than the width of the external terminal 31 (this is also similarly applicable to the examples illustrated in FIGS. 1D, 2D, and 3D). As a result, even in a case where the tab 23 has a line-symmetrical shape such as a rectangle, the position of the external terminal 39 can be easily recognized from the back surface of the semiconductor device 4.

In FIG. 4D, the external terminal 34 may be a ground terminal that is connected to the tab 23 at the bottom surface of the semiconductor device 4. Such a configuration allows the tab 23 to be mounted onto the ground surface of the substrate (not illustrated) by soldering or the like even in a case where a solder joint failure or a missing solder joint occurs in the external terminal 34. As a result, the grounding of the external terminal 34 can be ensured. Note that the external terminal 34 may be a ground terminal that is not connected to the tab 23 at the bottom surface of the semiconductor device 4 (this is also applicable to FIG. 1D). Further, in a configuration with or without connection to the tab 23, the ground terminal may be an external terminal other than the external terminal 34.

FIGS. 5A to 5D are views illustrating a semiconductor device 5 as an example of a resin-sealed semiconductor device according to the fifth embodiment. FIG. 5A, FIG. 5B, FIG. 5C, and FIG. 5D are a plan view, a right side view, a front view, and a bottom view, respectively, of the semiconductor device 5. In the fifth embodiment, a description of the same configurations, actions, and effects as those of the above-described embodiments will be simplified or omitted by referring to the descriptions already given above.

The semiconductor device 5 is a resin-sealed semiconductor device that includes a plurality of external terminals (fourteen external terminals 81 to 94 in this example). The package of the semiconductor device 5 is a quad-flat no-lead (QFN) package.

The external terminal 81 is an example of a first terminal that serves as an input terminal for an AC voltage or a rectified voltage. The external terminal 82 is an example of a second terminal that is provided next to the first terminal. The external terminals 83 to 94 are examples of a plurality of third terminals with a lower breakdown voltage relative to the first terminal and are different from the second terminal. At least one of the external terminals 83 to 94 may be, instead of the third terminal, a fourth terminal with a higher breakdown voltage relative to the plurality of third terminals and with a lower breakdown voltage relative to the first terminal.

The interval P1 between the high-voltage external terminal 81 and the external terminal 82, which is next to the external terminal 81, is wider than the interval P2 between the low-voltage external terminals 82 and 83. In the example illustrated in FIG. 5D, in a case where the widths of the external terminals 81, 82, and 83 are equal, the pitch p1 between the external terminal 81 and the external terminal 82 is wider than the pitch p2 between the external terminal 82 and the external terminal 83. As a result, a relatively wide interval P1 is ensured. Hence, even when an AC voltage or a rectified voltage with a relatively high voltage value is input to the external terminal 81, it is possible to suppress the potential occurrence of a short circuit between the external terminal 81 and the external terminal 82, and thus reduce failures that lead to IC breakdowns. Further, the cutout 23c may be included in the tab 23 to ensure a clearance between the tab 23 and the high-voltage external terminal 81. An electrically floating terminal may be provided between the external terminal 81 and the external terminal 82.

Figure 5C:
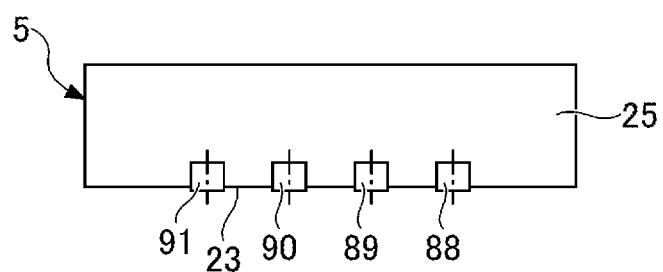
FIG. 5C is a front view of the resin-sealed semiconductor device according to the fifth embodiment.
Figure 5D:
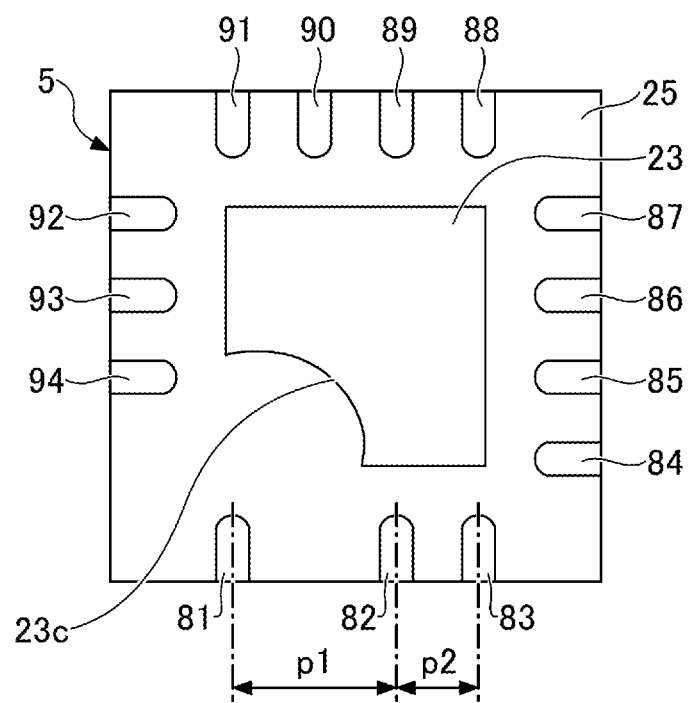
FIG. 5D is a bottom view of the resin-sealed semiconductor device according to the fifth embodiment.

In FIG. 5D, the external terminal 83 may be a ground terminal that is connected to the tab 23 at the bottom surface of the semiconductor device 5. Such a configuration allows the tab 23 to be mounted onto the ground surface of the substrate (not illustrated) by soldering or the like even in a case where a solder joint failure or a missing solder joint occurs in the external terminal 83. As a result, the grounding of the external terminal 83 can be ensured. Further, in a configuration with or without connection to the tab 23, the ground terminal may be an external terminal other than the external terminal 83.

Figure 8:
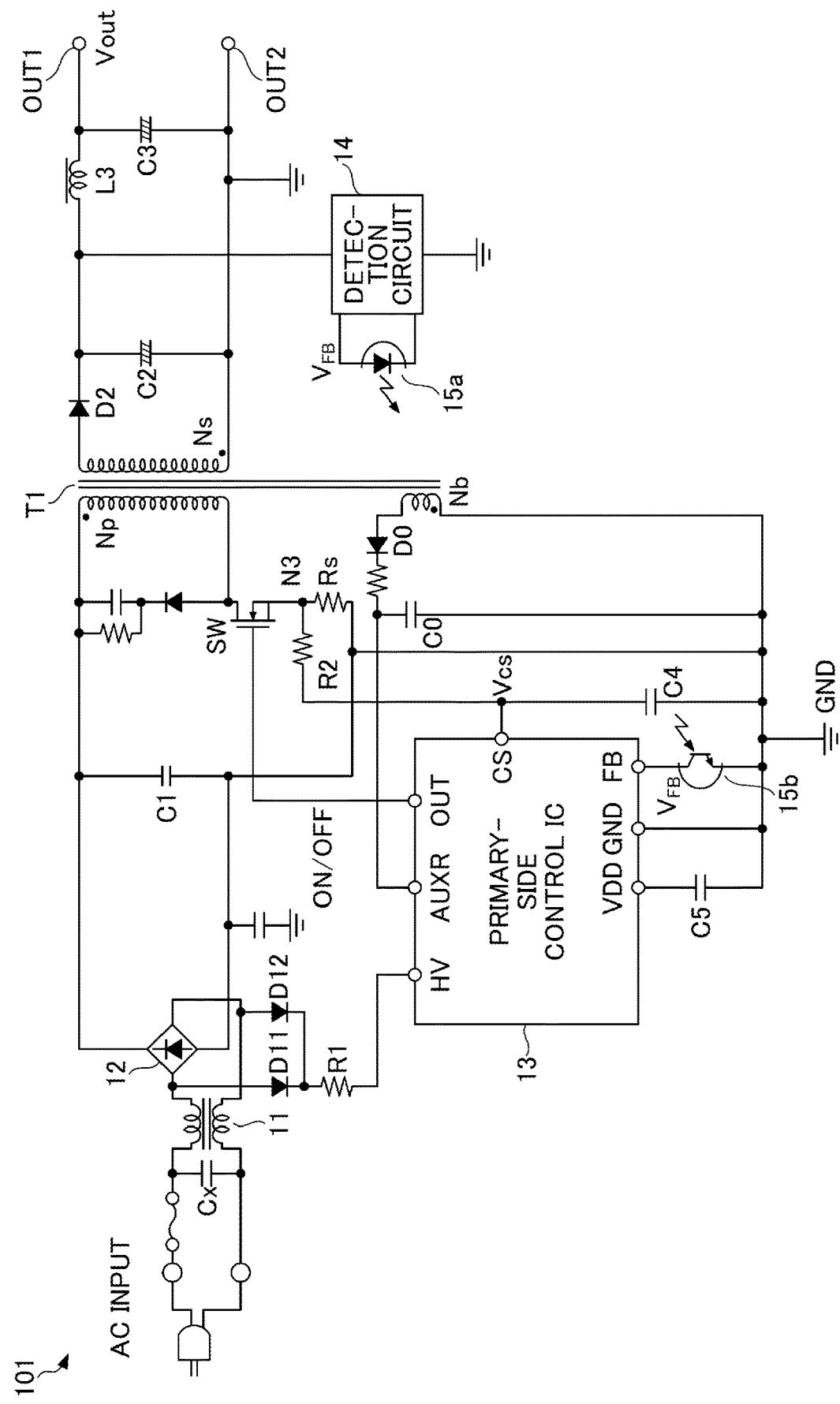
FIG. 8 is a circuit diagram illustrating an example of the first configuration of an AC-DC converter, according to an embodiment, as an insulated DC power supply device used in a portable device.

FIG. 8 is a circuit diagram illustrating an example of the first configuration of an AC-DC converter, according to an embodiment, as an insulated DC power supply device used in a portable device. In FIG. 8, an AC-DC converter 101, which serves as an insulated DC power supply device used in a portable device, is a portable electronic device that receives an AC voltage. A specific example of an AC-DC converter that serves as an insulated DC power supply device used in a portable device is, for example, a universal serial bus-power delivery (USB-PD) adapter.

The AC-DC converter as an insulated DC power supply device used in a portable device converts the input AC power into DC power and outputs the DC power. The DC power is supplied to a load device connected to output terminals OUT1 and OUT2. The AC-DC converter 101 generates and outputs a drive pulse to turn on and off a switching transistor SW (switch), which is configured to intermittently supply a current to a primary winding Np of a transformer T1, in response to input of a voltage (voltage Vcs) that is proportional to the current flowing through the primary winding Np of the transformer T1 and an output voltage detection signal that is from a secondary side of the transformer T1. The AC-DC converter 101 includes a power supply control circuit 13 that turns on and off the switching transistor SW so that a prescribed output voltage is obtained at the output terminals OUT1 and OUT2.

Note that the power supply device that can incorporate the power supply control circuit 13 is not limited to an AC-DC converter such as an AC adapter. The power supply control circuit 13 may be mounted on a power supply device other than an AC-DC converter or may be mounted on a power supply device that is incorporated in a product other than a portable device (for example, a television or a printer).

The AC-DC converter 101 includes an X capacitor Cx connected between AC terminals to attenuate normal mode noise, a noise cancellation filter 11 including a common mode coil, and a diode bridge circuit 12 that rectifies the AC voltage and converts the AC voltage into a DC voltage. The AC-DC converter 101 includes a smoothing capacitor C1 for smoothing the rectified voltage, the transformer T1 for voltage conversion, and the switching transistor SW connected in series to the primary winding Np of the transformer T1. The transformer T1 includes the primary winding Np, a secondary winding Ns, and an auxiliary winding Nb. The switching transistor SW is an element formed by an n-channel metal-oxide-semiconductor field-effect transistor (MOSFET). Alternatively, the switching transistor SW may be formed by a p-channel MOSFET or a bipolar transistor.

The power supply control circuit 13 drives the switching transistor SW. The power supply control circuit 13 can also be referred to as a power supply control IC.

On the secondary side of the transformer T1, the AC-DC converter 101 includes a rectifier diode D2, which is connected in series to the secondary winding Ns, and a smoothing capacitor C2, which is connected between the cathode terminal of the rectifier diode D2 and the other terminal of the secondary winding Ns. A synchronous rectifier switch may be used instead of the rectifier diode D2. The AC-DC converter 101 intermittently supplies a current to the primary winding Np to induce an AC voltage in the secondary winding Ns, and rectifies and smooths the induced AC voltage to output a DC voltage Vout corresponding to a turns ratio between the primary winding Np and the secondary winding Ns.

On the secondary side of the transformer T1, the AC-DC converter 101 includes a coil L3 and a capacitor C3 that form a filter for reducing switching ripple noise generated from the primary-side switching operation. The AC-DC converter 101 includes a detection circuit 14 for detecting the DC voltage Vout and a photodiode 15a that is connected to the detection circuit 14. The photodiode 15a is a light-emitting-side element of a photocoupler that transmits a signal corresponding to the detection voltage to the power supply control circuit 13. On the primary side of the transformer T1, the AC-DC converter 101 includes a photodiode 15b that is connected between a feedback terminal FB of the power supply control circuit 13 and a ground GND and serves as a light-receiving-side element that receives the signal from the detection circuit 14.

On the primary side of the transformer T1, the AC-DC converter 101 includes a rectifying/smoothing circuit that includes a rectifier diode D0, which is connected in series to the auxiliary winding Nb, and a smoothing capacitor C0, which is connected between the cathode terminal of the diode D0 and the ground GND. The voltage that is rectified and smoothed by the rectifying/smoothing circuit is applied to an input terminal AUXR of the power supply control circuit 13.

The AC-DC converter 101 includes diodes D11 and D12 each connected to a terminal for inputting non-rectified voltage to the diode bridge circuit 12, and a resistor R1 connected to the cathode of the diodes D11 and D12.

The power supply control circuit 13 includes a high-voltage start up terminal HV. An AC voltage that has not been rectified by the diode bridge circuit 12 is applied to the high-voltage start up terminal HV via the diodes D11 and D12 and the resistor R1. The power supply control circuit 13 is configured such that, at power-on (which is immediately after a plug is inserted into a socket [outlet]), the power supply control circuit 13 can be operated based on a voltage input from the high-voltage start up terminal HV before a voltage is induced in the auxiliary winding Nb at power-on.

A current detection resistor Rs is connected between the source terminal of the switching transistor SW and the ground GND. A resistor R2 is connected between a current detection terminal CS of the power supply control circuit 13 and a connection node N3 of the switching transistor SW and the current detection resistor Rs. A capacitor C4 is connected between the current detection terminal CS of the power supply control circuit 13 and the ground GND. The resistor R2 and the capacitor C4 form a low-pass filter. A current that flows through the primary winding Np flows to the current detection resistor Rs when the switching transistor SW is ON, thus generating a voltage that is proportional to the current flowing in the primary winding Np across both terminals of the current detection resistor Rs. The voltage that is generated across both terminals of the current detection resistor Rs is input to the current detection terminal CS via a low-pass filter formed by the resistor R2 and the capacitor C4. The voltage Vcs input to the current detection terminal CS is proportional to the current flowing in the primary winding Np.

Figure 9:
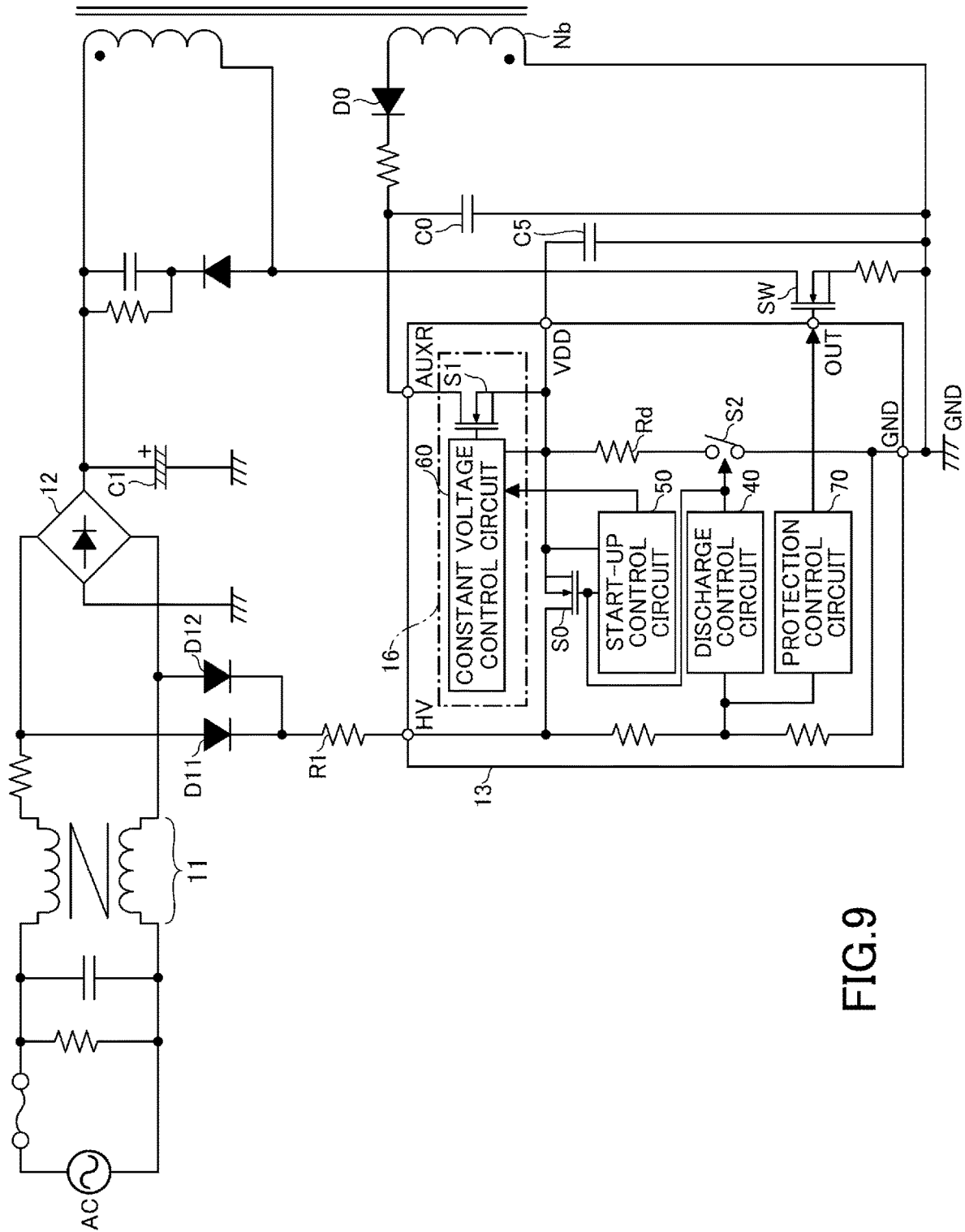
FIG. 9 is a diagram illustrating the configuration of an IC power supply unit of a primary-side circuit of a power supply device according to the embodiment.

FIG. 9 is a circuit diagram illustrating the configuration of an IC power supply unit of the primary-side circuit of the power supply device according to the embodiment. The power supply control circuit 13 includes a transistor S0 with a high breakdown voltage that is provided on a power supply line between the high-voltage start up terminal HV and a power-supply voltage terminal VDD, and a start-up control circuit 50 that activates the power supply control circuit 13 by turning on the transistor S0 in response to a voltage being input to the high-voltage start up terminal HV. The start-up control circuit 50 is electrically connected to the high-voltage start up terminal HV via the transistor S0. The power supply control circuit 13 includes a discharge control circuit 40 that monitors the voltage of the high-voltage start up terminal HV to detect whether the plug is not in the socket and discharges the X capacitor Cx when it is determined that the plug is not in the socket. The discharge control circuit 40 determines whether the plug is not in the socket by, for example, detecting that the AC input voltage has not fallen below a predetermined value (for example, 75% of the peak value) within a certain period of time (for example, 30 milliseconds). The discharge control circuit 40 is electrically connected to the high-voltage start up terminal HV to monitor the voltage of the high-voltage start up terminal HV.

The transistor S0 is turned on by the start-up control circuit 50 immediately after an AC voltage is input to the high-voltage start up terminal HV, and the transistor S0 supplies a current from the high-voltage start up terminal HV to a capacitor C5, which is connected to the power-supply voltage terminal VDD, to ensure the voltage of the power-supply voltage terminal VDD. The transistor S0 is turned off by the start-up control circuit 50 when the voltage of the power-supply voltage terminal VDD becomes higher than or equal to a predetermined value (for example, 21 V).

Further, when the voltage of the power-supply voltage terminal VDD becomes higher than or equal to the predetermined value (for example, 21 V) in response to the transistor S0 being turned on, a transistor S1 is turned on, the relatively high DC voltage supplied to the input terminal AUXR from the auxiliary winding Nb is step-down regulated by the constant voltage control circuit 60, and the constant voltage control circuit 60 outputs the step-down regulated voltage to a power supply line connected to the power-supply voltage terminal VDD. Subsequently, since the voltage from the auxiliary winding Nb is supplied to the power-supply voltage terminal VDD, the internal circuit of the power supply control circuit 13 continues to operate based on the voltage regulated by the transistor S1 even when the transistor S0 is in the OFF state.

The discharge control circuit 40 causes the current that flows from the high-voltage start up terminal HV via the transistor S0 to flow to the ground GND. The discharge control circuit 40 discharges the X capacitor Cx by causing the charge to flow to the ground GND via the high-voltage start up terminal HV, the transistor S0, a discharge resistor Rd, and a switch S2.

The power supply control circuit 13 may also include a protection control circuit 70 that stops the operation of the power supply control circuit 13 based on the voltage drop of the high-voltage start up terminal HV. The protection control circuit 70 is electrically connected to the high-voltage start up terminal HV to monitor the voltage of the high-voltage start up terminal HV.

The protection control circuit 70 includes, for example, a brown-out detection circuit that stops switching control by detecting a brown-out condition in which the AC input voltage drops to a predetermined voltage or less continuously for a certain period of time or more. The brown-out detection circuit detects that the voltage of the high-voltage start up terminal HV has dropped to, for example, less than 85 V. For example, when the brown-out detection circuit detects that the voltage of the high-voltage start up terminal HV has been less than, for example, 85 V for a certain period of time (for example, 60 milliseconds) or longer, the brown-out detection circuit can prevent the drive pulse of the switching transistor SW from being output.

When a no-lead resin-sealed semiconductor device such as the semiconductor device 1 described above is applied to the power supply control circuit 13, the power supply control circuit 13 can be made smaller than a case where a leaded resin-sealed semiconductor device such as an SOP is applied. As a result, the AC-DC converter 101 including the power supply control circuit 13 can be made smaller. Further, when a no-lead resin-sealed semiconductor device such as the semiconductor device 1 described above is applied to the power supply control circuit 13, the power supply control circuit 13 can be mounted by reflow soldering.

The high-voltage start up terminal HV is an example of the first terminal that is an input terminal to which an AC voltage or a rectified voltage is input. The high-voltage start up terminal HV is connected to the transistor S0 that has a breakdown voltage of, for example, 500 V or more. Such a configuration allows input of an AC voltage with a relatively high voltage value.

In a case where an AC voltage of 100 V (100 VAC) is used such as in Japan, the peak AC voltage is 141 V. In countries such as those in Europe that use an AC voltage of 230 (230 VAC), the peak AC voltage is 324 V. An actual product is designed based on an assumption that an AC input will have a variation of, for example, 15%. A device such as a universal AC adapter (which can be used for 100 VAC and 230 VAC) is designed to operate even at 264 VAC, which is 15% higher than 230 VAC. Since 372 V is the peak voltage of 264 VAC, the breakdown voltage of high-voltage start up terminal HV needs to be at least 372 V. Hence, in consideration of the margin, it is preferable for the breakdown voltages of the high-voltage start up terminal HV and the transistor S0 to be 500 V or more.

The power-supply voltage terminal VDD may be assigned to, for example, the second terminal that is provided next to the first terminal. An electrically floating terminal, that is, a not connected (NC) terminal may be interposed between the power-supply voltage terminal VDD and the high-voltage start up terminal HV.

At least one of the feedback terminal FB, the output terminals OUT, the current detection terminal CS, the ground GND, or the power-supply voltage terminal VDD may be assigned to a third terminal with a lower breakdown voltage relative to the first terminal and is different from the second terminal.

The input terminal AUXR is an example of the fourth terminal with a higher breakdown voltage relative to the plurality of the third terminals and a lower breakdown voltage relative to the first terminal. The input terminal AUXR is connected to the transistor S1 that has a breakdown voltage that is higher than, for example, 30 V and is lower than 740 V. For example, the transistor S1 has a breakdown voltage that is higher than or equal to 180 V. Such a configuration can cope with the input of a DC voltage with a relatively high voltage value supplied from the auxiliary winding Nb, and can also cope with variation in the voltage of the auxiliary winding Nb that is caused from the variation in the output voltage Vout. For example, in the case of the AC-DC converter 101 in which the DC voltage Vout changes from 3 V to 20 V and a voltage is generated by the auxiliary winding Nb at a turns ratio that is fourfold of the DC voltage Vout, the voltage of the auxiliary winding Nb will change from 12 V to 80 V. Hence, in consideration of the margin, it is preferable for the breakdown voltages of the input terminal AUXR and the transistor S1 for a regulator 16 to be higher than or equal to 180 V.

Figure 10:
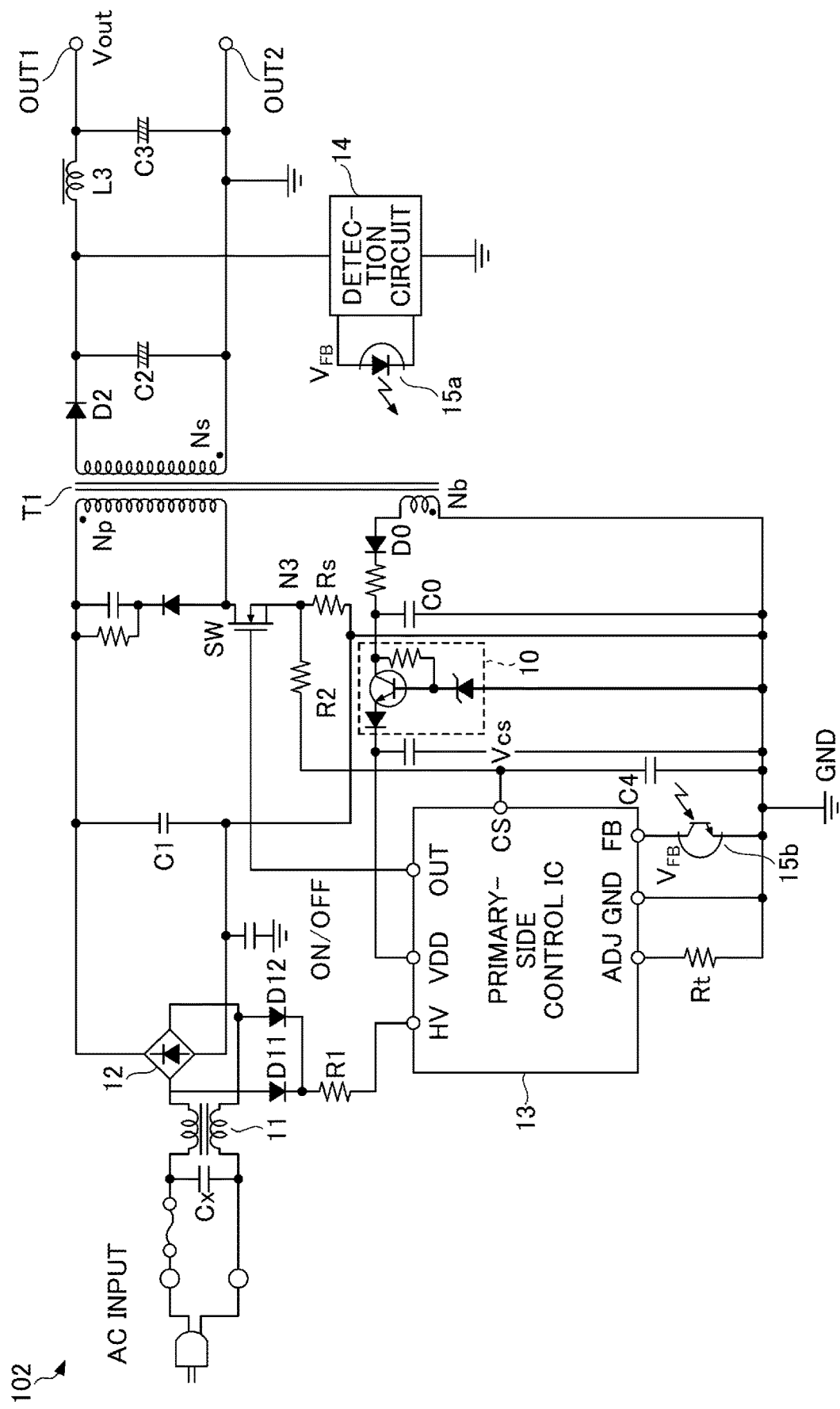
FIG. 10 is a circuit diagram illustrating an example of the second configuration of the AC-DC converter, according to the embodiment, as the insulated DC power supply device used in the portable device.

FIG. 10 is a circuit diagram illustrating an example of the second configuration of the AC-DC converter, according to the embodiment, as the insulated DC power supply device used in a portable device. In the example of the second configuration illustrated in FIG. 10, a description of the same configurations, actions, and effects as those in the example of the first configuration (the AC-DC converter 101) illustrated in FIGS. 8 and 9 will be simplified or omitted by referring to the descriptions already given above. In the example of the first configuration (the AC-DC converter 101) illustrated in FIGS. 8 and 9, the regulator 16 incorporated in the power supply control circuit 13 serves as the regulator circuit that converts the voltage induced by the auxiliary winding Nb of the transformer T1 into a predetermined voltage. In contrast, in the example of the second configuration (an AC-DC converter 102) illustrated in FIG. 10, a regulator 10 externally connected to the power supply control circuit 13 serves as the regulator circuit that converts the voltage induced by the auxiliary winding Nb of the transformer T1 into a predetermined voltage.

The regulator 10 is connected between the power-supply voltage terminal VDD and the auxiliary winding Nb. The relatively high voltage induced by the auxiliary winding Nb is stepped down by the regulator 10 and subsequently input to the power-supply voltage terminal VDD. Hence, the power-supply voltage terminal VDD can be assigned to the second terminal or the third terminal with a relatively low breakdown voltage.

The power supply control circuit 13 may also include an external setting terminal ADJ that provides setting information from an external source. For example, an external resistor Rt is connected to the external setting terminal ADJ, and the power supply control circuit 13 operates in an operation mode that corresponds to the voltage of the external setting terminal ADJ. The power supply control circuit 13 may be configured so that it may be set to a latch-stop mode executable state or set to a state in which the switching transistor SW is forcibly turned off based on the voltage of the feedback terminal FB, depending on the voltage of the external setting terminal ADJ. Furthermore, the power supply control circuit 13 may be configured so that the voltage value of the feedback terminal FB, which causes the switching transistor SW to be forcibly turned off, can be set discretionarily from the external source.

Figure 11:
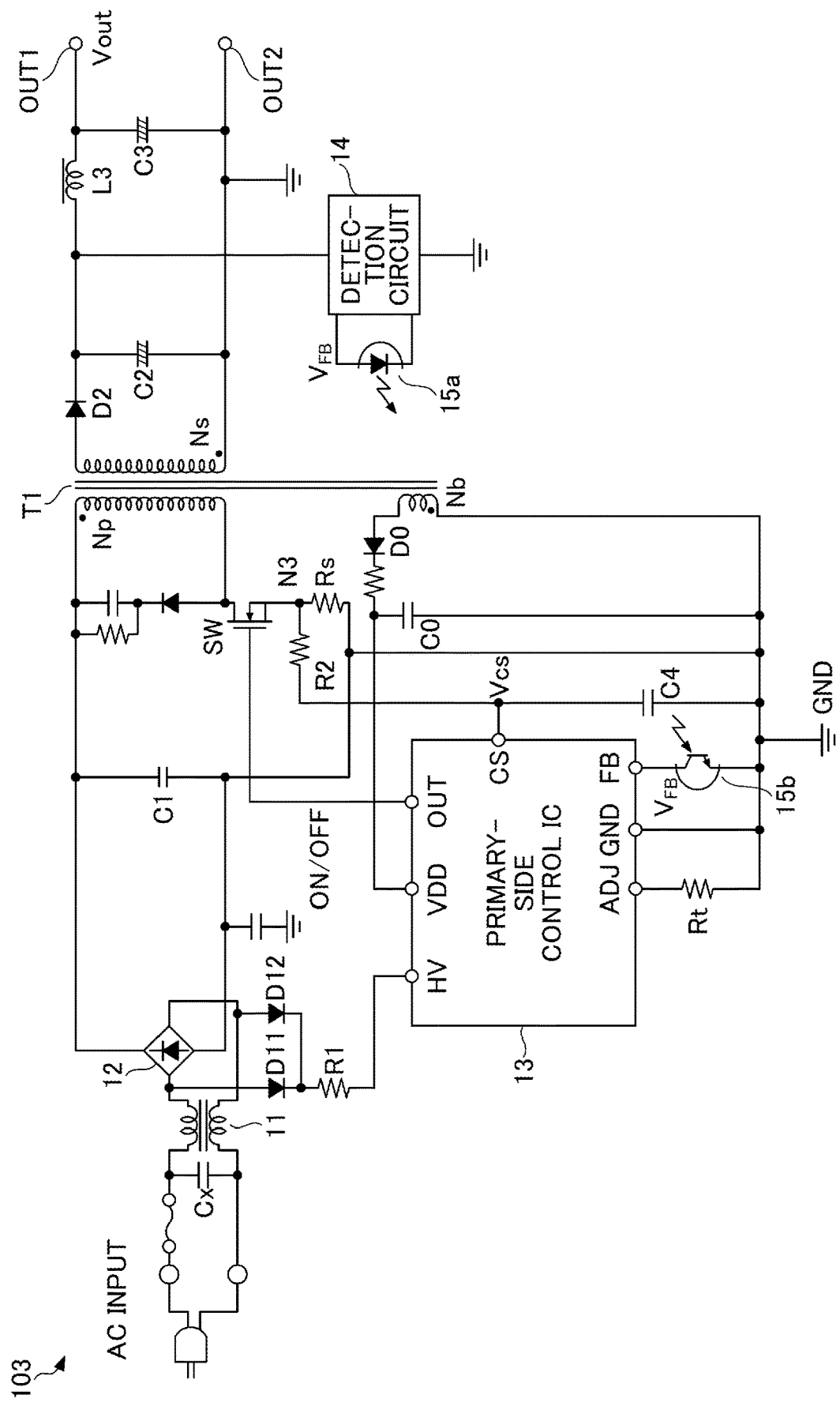
FIG. 11 is a circuit diagram illustrating an example of the third configuration of the AC-DC converter, according to the embodiment, as the insulated DC power supply device used in the portable device.

FIG. 11 is a circuit diagram illustrating an example of the third configuration of the AC-DC converter, according to the embodiment, as the insulated DC power supply device used in a portable device. In the example of the third configuration illustrated in FIG. 11, a description of the same configurations, actions, and effects as those in the example of the first configuration and those in the example of the second configuration illustrated in FIGS. 8 to 10 will be simplified or omitted by referring to the descriptions already given above. The example of the third configuration (an AC-DC converter 103) illustrated in FIG. 11 differs from the example of the second configuration (the AC-DC converter 102) illustrated in FIG. 10 in that the AC-DC converter 103 does not include the regulator 10. That is, the regulator circuit that converts the voltage induced by the auxiliary winding Nb of the transformer T1 into a predetermined voltage may be absent. Such a configuration can facilitate miniaturization since the regulator circuit is absent.

The embodiments have been described above. However, the techniques of the disclosure are not limited to those described in the above embodiments. Various changes and modifications can be made by combining or substituting some or all of the embodiments.

For example, the package of the resin-sealed semiconductor device may be a no-lead package other than SON or QFN.

Furthermore, the number of external terminals are not limited to those illustrated on the accompanying drawings.

What is claimed is:

1. A power supply control semiconductor device that generates and outputs a drive pulse to turn on and off a switch, which is configured to intermittently supply a current to a primary winding of a voltage conversion transformer, in response to input of both a voltage that is proportional to the current flowing through the primary winding of the voltage conversion transformer and an output voltage detection signal that is from a secondary side of the voltage conversion transformer,
  wherein a package of the power supply control semiconductor device is a no-lead resin-sealed package,
    wherein the package includes a plurality of external terminals including
      a first terminal that is an input terminal to which an AC voltage or a rectified voltage is input,
      a second terminal provided next to the first terminal, and
      a plurality of third terminals that have a lower breakdown voltage relative to the first terminal and are different from the second terminal, and
    wherein an interval between the first terminal and the second terminal is wider than each interval between the plurality of third terminals.

2. The power supply control semiconductor device according to claim 1, comprising at least one circuit, the at least one circuit being a start-up control circuit configured to start an operation of the power supply control semiconductor device, a discharge control circuit configured to release a charge supplied from the first terminal, or a protection control circuit configured to stop the operation of the power supply control semiconductor device based on a voltage drop in the first terminal,
  wherein the at least one circuit is electrically connected to the first terminal.

3. The power supply control semiconductor device according to claim 1, wherein the plurality of external terminals include a fourth terminal with a higher breakdown voltage relative to the plurality of third terminals and with a lower breakdown voltage relative to the first terminal, and
  wherein the power supply control semiconductor device includes a regulator configured to convert a voltage, which is induced by an auxiliary winding of the voltage conversion transformer and is input to the fourth terminal, into a predetermined voltage.

4. The power supply control semiconductor device according to claim 1, wherein the second terminal is situated between the first terminal and a third terminal among the plurality of third terminals and is an electrically floating terminal.

5. The power supply control semiconductor device according to claim 1, wherein an exposed tab is provided on a bottom surface of the power supply control semiconductor device, and
  wherein a shortest distance between the exposed tab and the first terminal is longer than a shortest distance between the exposed tab and any one of the plurality of external terminals other than the first terminal.

6. The power supply control semiconductor device according to claim 5, wherein the plurality of external terminals include a ground terminal electrically connected to the exposed tab.

7. The power supply control semiconductor device according to claim 1, wherein an exposed die attach film is provided on a bottom surface of the power supply control semiconductor device.

8. A power supply control semiconductor device that generates and outputs a drive pulse to turn on and off a switch, which is configured to intermittently supply a current to a primary winding of a voltage conversion transformer, in response to input of both a voltage that is proportional to the current flowing through the primary winding of the voltage conversion transformer and an output voltage detection signal that is from a secondary side of the voltage conversion transformer,
  wherein a package of the power supply control semiconductor device is a no-lead resin-sealed package,
    wherein the package includes a plurality of external terminals including
      a first terminal that is an input terminal to which an AC voltage or a rectified voltage is input,
      a second terminal provided next to the first terminal,
      a plurality of third terminals that have a lower breakdown voltage relative to the first terminal and are different from the second terminal, and
      an exposed tab provided on a bottom surface of the power supply control semiconductor device, and
    wherein a shortest distance between the exposed tab and the first terminal is longer than a shortest distance between the exposed tab and any one of the plurality of external terminals other than the first terminal.

9. The power supply control semiconductor device according to claim 8, wherein the second terminal is electrically floating.

10. The power supply control semiconductor device according to claim 8, wherein the plurality of external terminals include a ground terminal electrically connected to the exposed tab.

11. A power supply device comprising:
  the power supply control semiconductor device of claim 1;
  the voltage conversion transformer whose primary side receives the AC voltage or the rectified voltage; and
  the switch controlled by the power supply control semiconductor device.

* * * * *